(12) United States Patent
Matsuzaki et al.

(10) Patent No.: US 7,778,069 B2
(45) Date of Patent: Aug. 17, 2010

(54) SEMICONDUCTOR DEVICE AND ITS FABRICATION METHOD

(75) Inventors: Nozomu Matsuzaki, Kodaira (JP); Kenichi Osada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 204 days.

(21) Appl. No.: 12/090,458

(22) PCT Filed: Oct. 17, 2005

(86) PCT No.: PCT/JP2005/019042

§ 371 (c)(1),
(2), (4) Date: Apr. 16, 2008

(87) PCT Pub. No.: WO2007/046128

PCT Pub. Date: Apr. 26, 2007

(65) Prior Publication Data

US 2009/0237985 A1    Sep. 24, 2009

(51) Int. Cl.
*G11C 11/00* (2006.01)

(52) U.S. Cl. .................. 365/163; 365/113; 365/185.08

(58) Field of Classification Search ................. 365/163, 365/100, 113, 148, 185.03, 185.08
See application file for complete search history.

(56) References Cited

U.S. PATENT DOCUMENTS

| | | | |
|---|---|---|---|
| 5,166,758 A | 11/1992 | Ovshinsky et al. | |
| 6,324,093 B1 | 11/2001 | Perner et al. | |
| 6,584,029 B2 | 6/2003 | Tran et al. | |
| 6,593,158 B1 | 7/2003 | Takahashi | |
| 7,265,050 B2 * | 9/2007 | Choi et al. | 438/672 |
| 7,336,525 B2 * | 2/2008 | Fujita et al. | 365/154 |
| 7,475,219 B2 * | 1/2009 | O'Connor et al. | 711/202 |
| 2006/0034116 A1 * | 2/2006 | Lam et al. | 365/151 |
| 2008/0087982 A1 * | 4/2008 | Fujii | 257/530 |
| 2009/0116288 A1 * | 5/2009 | Varkony | 365/185.13 |

FOREIGN PATENT DOCUMENTS

| | | |
|---|---|---|
| CN | 1345071 A | 4/2002 |
| JP | 5-21740 | 5/1993 |
| JP | 5-291520 | 11/1993 |
| JP | 2001-44392 | 2/2001 |
| JP | 2002-117684 | 4/2002 |
| JP | 2003-142653 | 5/2003 |
| JP | 2003-332530 | 11/2003 |
| JP | 2004-153047 | 5/2004 |
| JP | 2005-57111 | 3/2005 |

\* cited by examiner

*Primary Examiner*—Gene N. Auduong
(74) *Attorney, Agent, or Firm*—Mattingly & Malur, P.C.

(57) ABSTRACT

An electrically rewritable non-volatile memory device is configured by the EEPROM 3, and an electrically non-rewritable non-volatile memory device is configured by the OTPROM 4a. Both the EEPROM 3 and the OTPROM 4a are configured by phase change memory devices each of which can be fabricated in the same fabrication step and at a low cost. The EEPROM3 uses a phase change memory device in which an amorphous state and a crystal state of a phase change material are used for memory information, while the OTPROM 4a uses a phase change memory device in which a non-disconnection state and a disconnection state of a phase change material are used for memory information.

13 Claims, 14 Drawing Sheets

18b  18a

BIASED TIME

CHIP

CHIP  CSE

SEMICONDUCTOR DEVICE AND ITS FABRICATION METHOD

TECHNICAL FIELD

The present invention relates to a semiconductor device and its fabrication method, and in particular to an effective technique applied to a semiconductor device mounting non-volatile memory devices in a mixed manner.

BACKGROUND ART

A semiconductor logic unit performs various operation processings under control of a system program. When a scale of the system program is large, an external memory device, for example, a magnetic disk, an optical disk, or the like is used for a storage location for the system program. When the scale of the system program is small, a non-volatile memory device fabricated on other substrate different from a substrate on which an operation processing section is formed for the storage location for the system program is used. One of typical examples of the non-volatile memory device is a flash memory in which, for example, a floating-gate type device accumulating charges in an electrode or a silicon-nitride trapping device capturing charges in an insulation film is used. Further, when the scale of the system program is small and it is necessary to reduce a size of the system itself, a non-volatile memory device fabricated on the same substrate on which the operation processing section has been formed for a storage location for the system program is used. As a semiconductor logic unit including non-volatile memory devices on the same substrate in a mixed manner, there is, for example, an IC (Integrated Circuit) card micro controller or an embedded micro controller.

In recent years, as one of memory cell techniques attracting attention to a new electrically rewritable non-volatile memory device, there is a phase change memory device. The phase change memory device is a phase change memory device in which chalcogenide used in, for example, CD-RW (Compact Disk Rewritable), DVD-RW (Digital Versatile Disk Rewritable), DVD-RAM (Digital Versatile Disk Random Access Memory) or the like, all of which are a rewritable optical memory medium, is applied to a memory device. The principle thereof is to utilize an amorphous state where electrical resistance is relatively high and a crystal state where electrical resistance is relatively low as memory information to read the memory information as an electric signal, and rewriting of the memory information plural times is made possible. The amorphous state and the crystal state are selectively produced by adjusting heat imparted to the memory device and a cooling rate of the memory device. That is, the amorphous state is formed by heating a phase change material up to a melted state thereof and the cooling it rapidly. The crystal state is formed by heating the phase change material up to the melted state thereof and then cooling it gradually or by maintaining a formed amorphous state at a crystallization temperature and then cooling it. Since the phase change memory device has such a merit that a fabrication process thereof is simpler than that of a conventional non-volatile memory device such as a flash memory, and since a memory device itself can be made fine, fabrication thereof at a low cost is expected.

For example, a phase change memory device in which a process temperature is not restricted when being fabricated and fabrication thereof is simple, and its fabrication method have been disclosed (see Patent Document 1, for example). A memory device structure in which a phase change material in a phase change material memory device structure can be more efficiently heated and a method for forming it have been disclosed (see Patent Document 2, for example).

Patent Document 1: Japanese Patent Application Laid-open Publication No. 2004-153047

Patent Document 2: Japanese Patent Application Laid-open Publication No. 2003-332530

DISCLOSURE OF THE INVENTION

In the IC card micro controller, a system program is written in a non-volatile memory device under a wafer state or a chip state, and then a semiconductor logic unit including the non-volatile memory devices in a mixed manner is bonded to a card substrate in an adhesion process with heating. In the embedded micro controller, a system program is written in a non-volatile memory device in a state of being encapsulated state in a package, and then a semiconductor logic unit including the non-volatile memory devices in a mixed manner is mounted on a circuit board by soldering at a temperature of, for example, approximately 260° C. For that reason, it is required that the memory information stored in the non-volatile memory device is not volatilized even if the non-volatile memory device is subjected to heat in mounting. For example, in a conventional non-volatile memory device such as a flash memory, the memory information is not lost by the above-mentioned heat treatment at the time of mounting.

However, in the phase change material constituting the phase change memory device, crystallization thereof progresses by heat. The crystallization of the phase change material is hard to occur for ten years or more in an operating temperature range for a semiconductor product (approximately 0 to 85° C., for example). However, the crystallization of the phase change material is progressed rapidly during a bonding process of the semiconductor logic unit to the card substrate in the fabrication step of the above-mentioned IC card micro controller or during soldering of the semiconductor logic unit to the circuit board in the fabrication step of the embedded micro controller, and it is extremely difficult to prevent the crystallization. For that reason, since there is such a possibility that the phase change memory device loses the memory information due to the above-mentioned heat treatment at the time of mounting, there is such a problem that the phase change memory device is hard to adapt to a fabrication step of writing the memory information before mounting. In view of these circumstances, the present inventors have studied avoidance of such a problem that the memory information is lost due to the above-mentioned heat treatment during mounting by writing the memory information into the phase change memory device after mounting, with using the phase change memory device only for a non-volatile memory device which requires rewriting of the memory information and stores specific memory information.

However, since the phase change memory device can be fabricated at a low cost, it is desired to use the phase change memory device for a non-volatile memory device which does not require rewriting of the memory information. In the phase change memory device used for such an application, since rewriting of the memory information is not required, it is preferable that writing of the memory information into the phase change memory device is performed before mounting rather than after mounting. However, as described above, when the memory information is written into the phase change memory device before mounting, there is such a problem that the memory information is lost by the heat treatment at the time of mounting.

The typical ones of the inventions disclosed in this application will be briefly described as follows.

A semiconductor device according to the present invention comprises an electrically rewritable first non-volatile memory device, and an electrically non-rewritable second non-volatile memory device on the same semiconductor substrate, wherein the first non-volatile memory device is configured by a first phase change memory device capable of rewriting the memory information plural times, and the second non-volatile memory device is configured by a second phase change memory device capable of writing the memory information only one time, and information holding sections of the first and second phase change memory devices have the same structure.

A fabrication method of a semiconductor device according to the present invention comprises the steps of: forming a first field effect transistor of a low withstand voltage system on an electrically rewritable first non-volatile memory device formation region, and forming a second field effect transistor of a high withstand voltage system on an electrically non-rewritable second non-volatile memory device formation region, by a unit of one chip on a semiconductor wafer; respectively forming phase change materials electrically connected to drain regions of the first and second field effect transistors, forming a first phase change memory device comprising the first field effect transistor and the phase change material on the first non-volatile memory device formation region, and forming a second phase change memory device comprising the second field effect transistor and the phase change material on the second non-volatile memory device formation region; inspecting a semiconductor device including the first non-volatile memory device and the second non-volatile memory device on the semiconductor wafer by a unit of one chip, and simultaneously writing the memory information in the second phase change memory device; and rewriting the memory information of the first phase change memory device after mounting an individual chip obtained by cutting the semiconductor wafer on a mounting substrate.

An effect obtained by typical ones of the inventions disclosed in the present application will be briefly described below.

A semiconductor device can be fabricated at a low cost.

BRIEF DESCRIPTIONS OF THE DRAWINGS

Figure 5A:
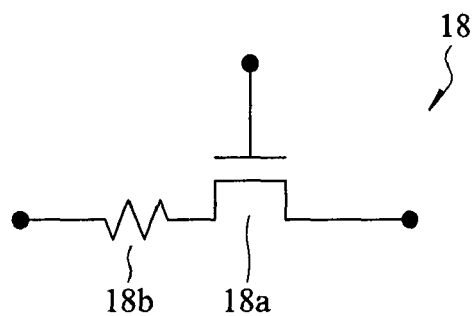
Figure 5B:
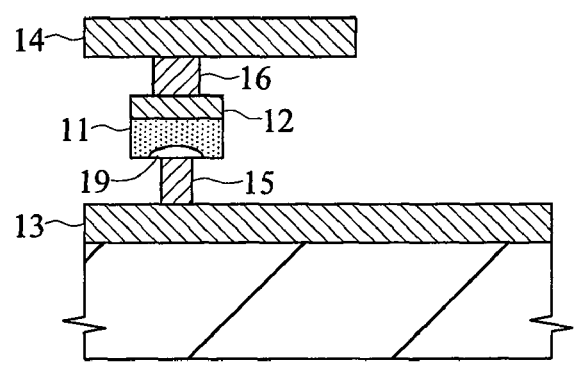
Figure 5C:
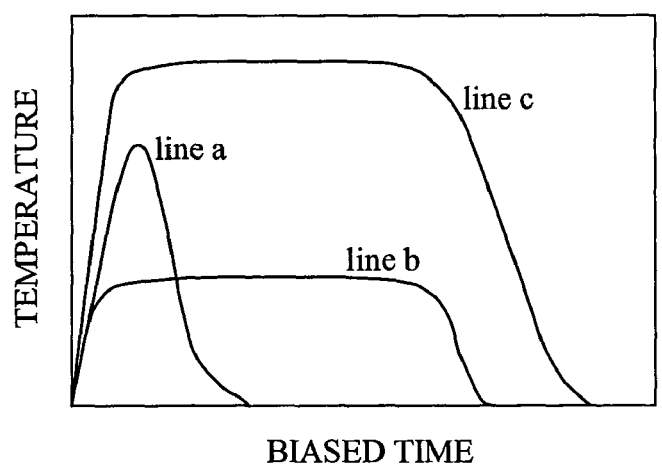
Figure 6:
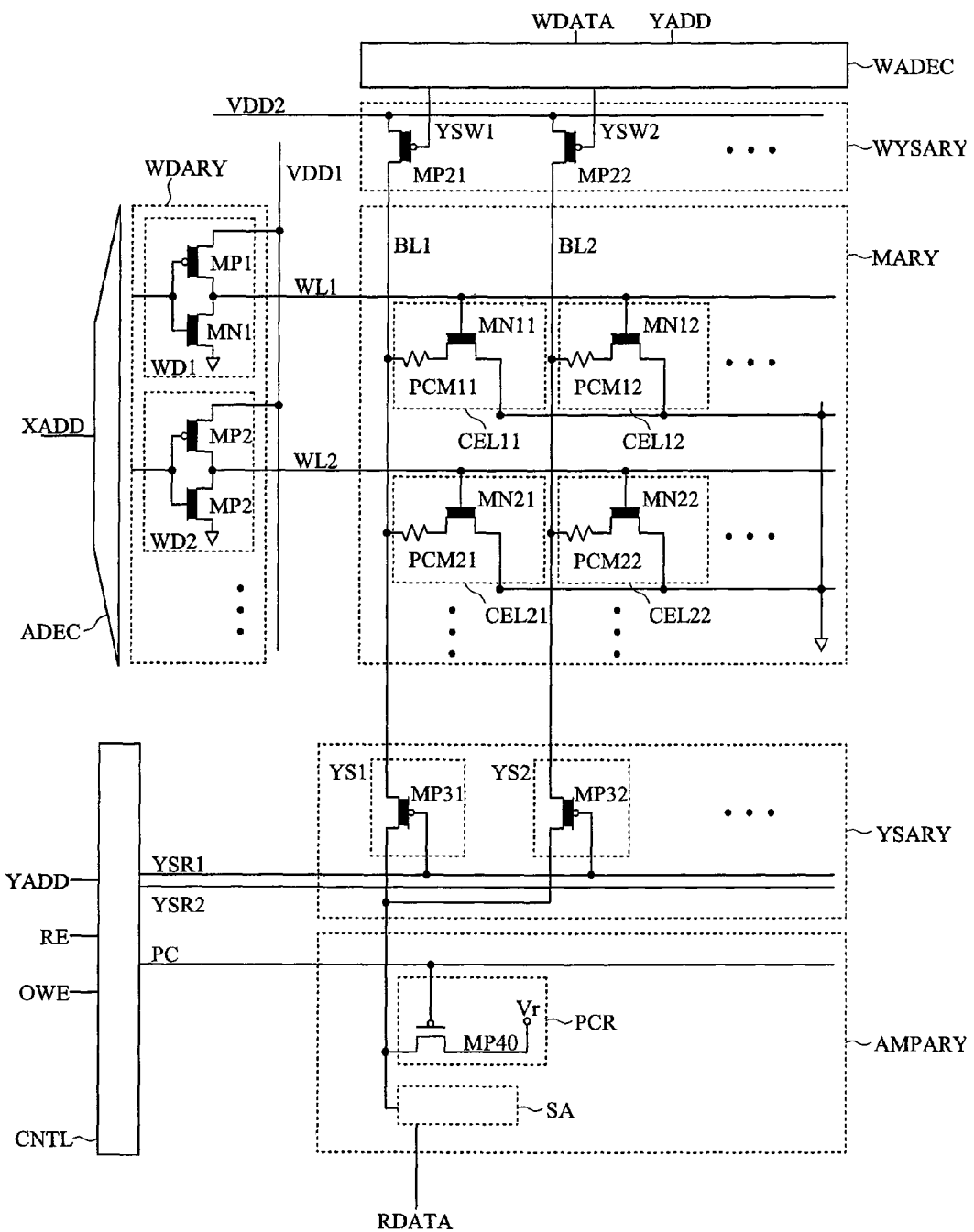
Figure 7:
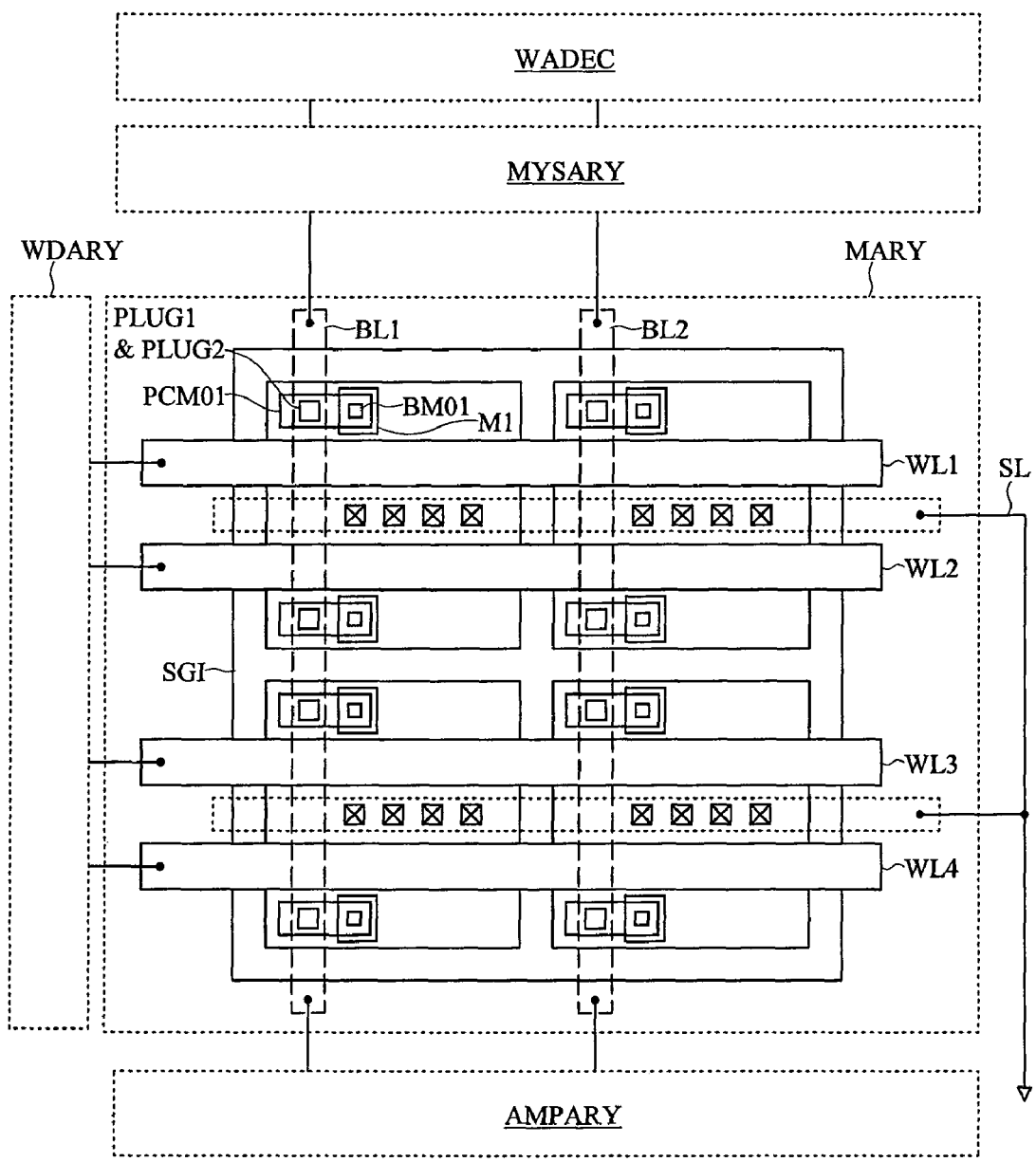
Figure 8:
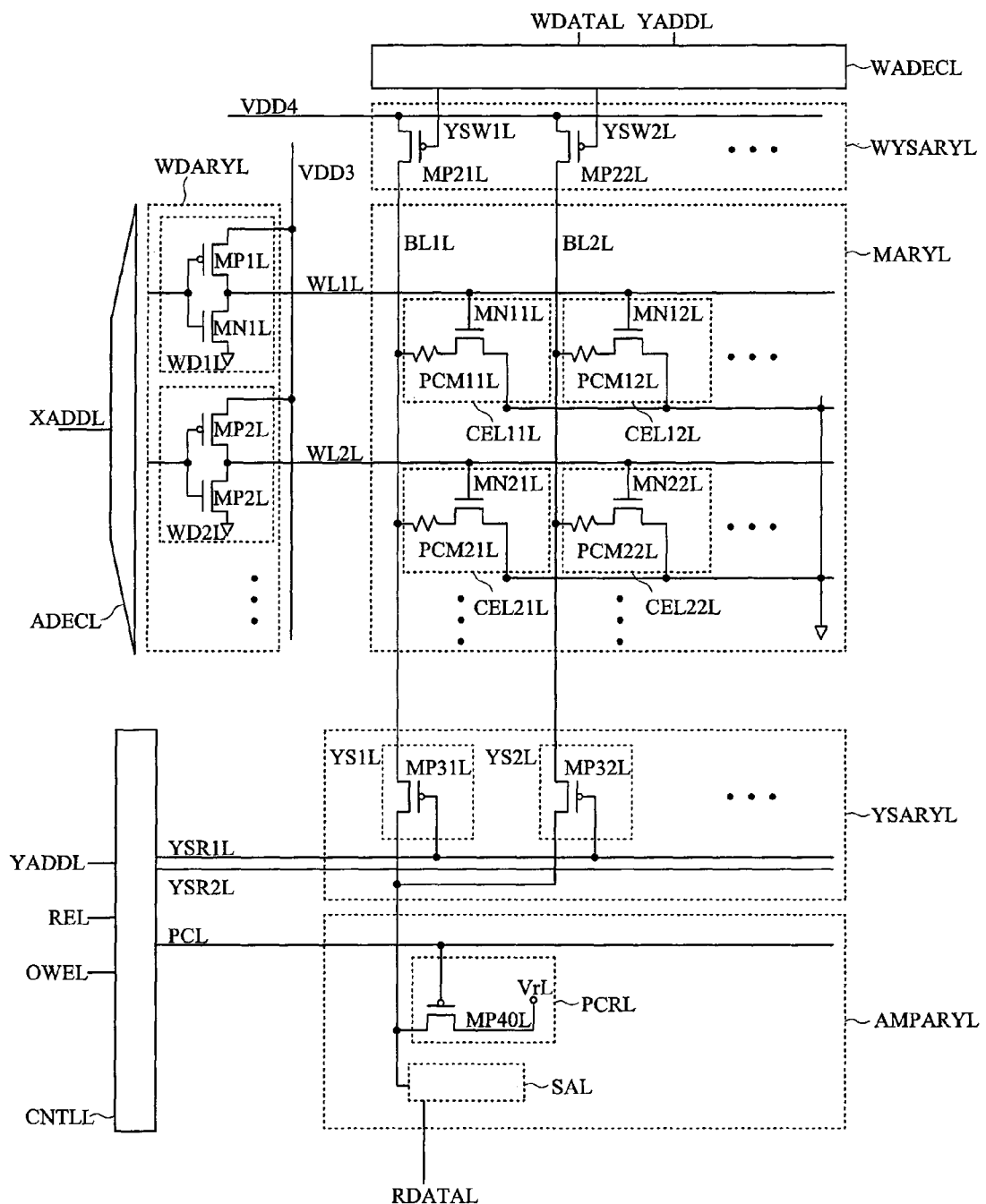
Figure 9:
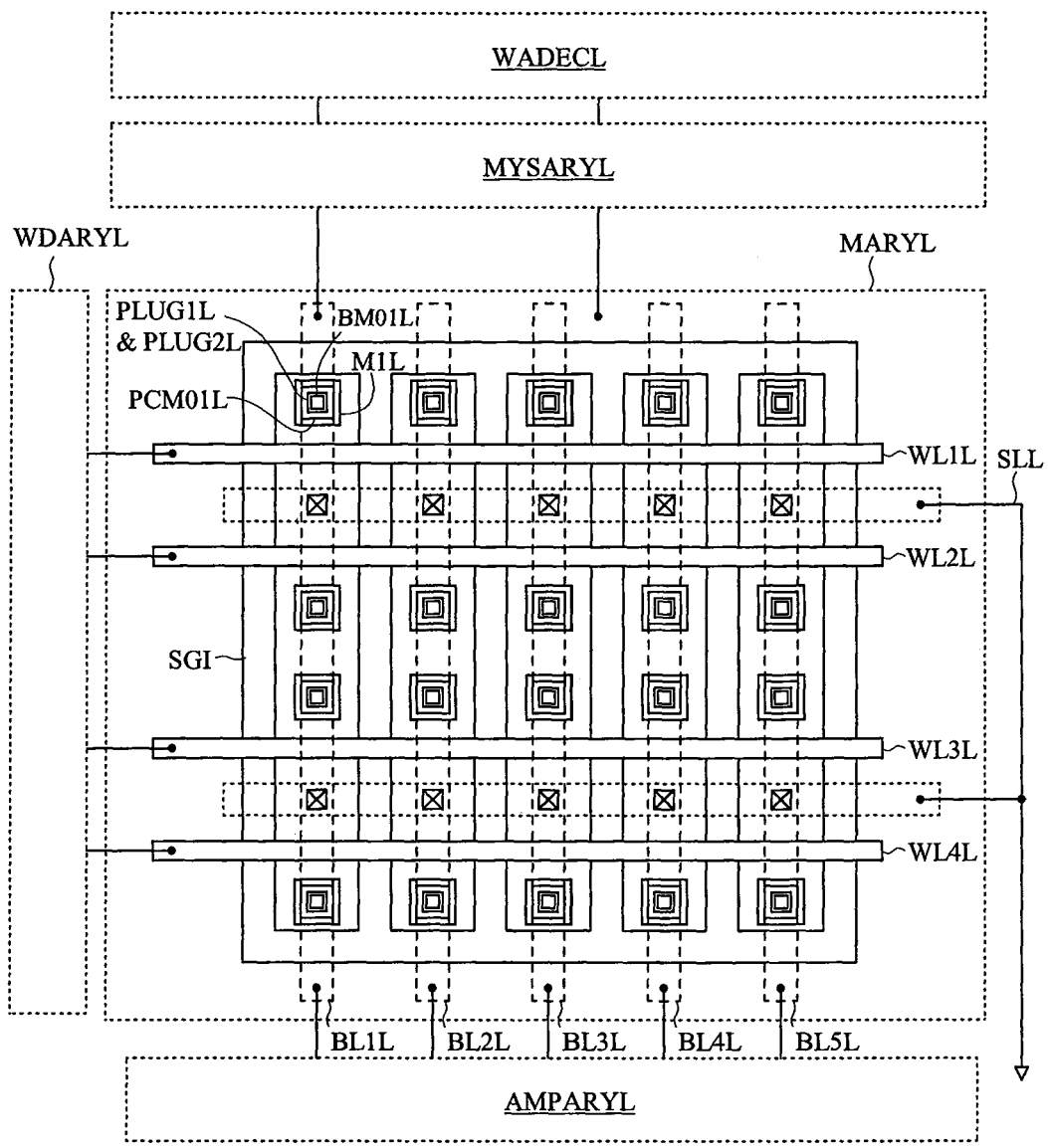
Figure 10:
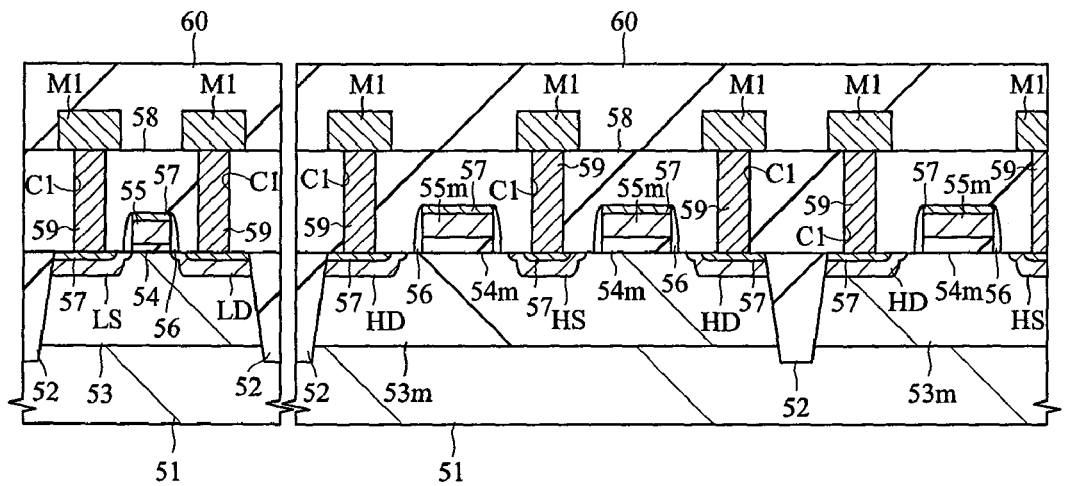
Figure 11:
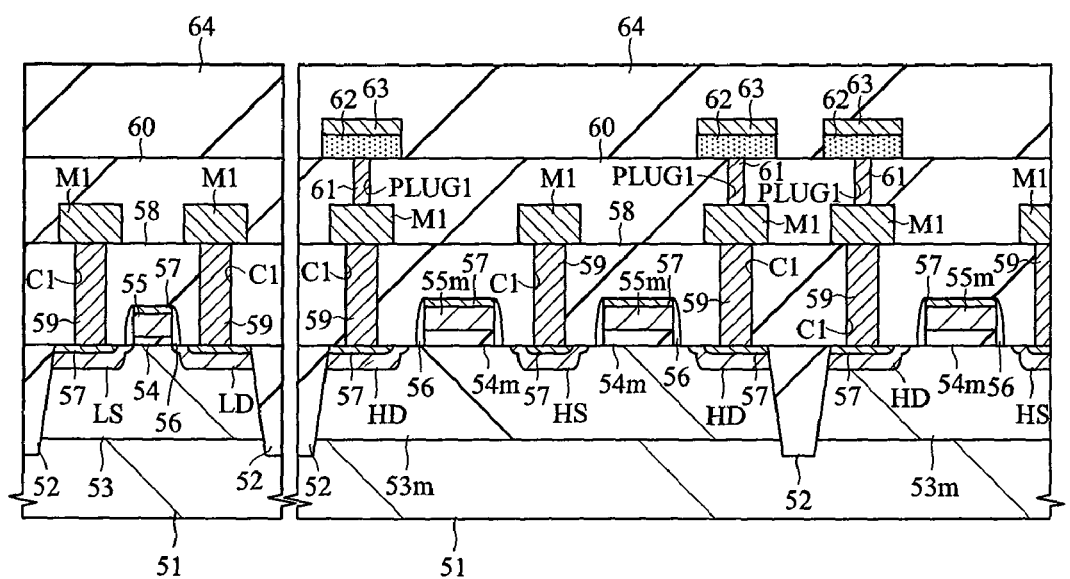
Figure 12:
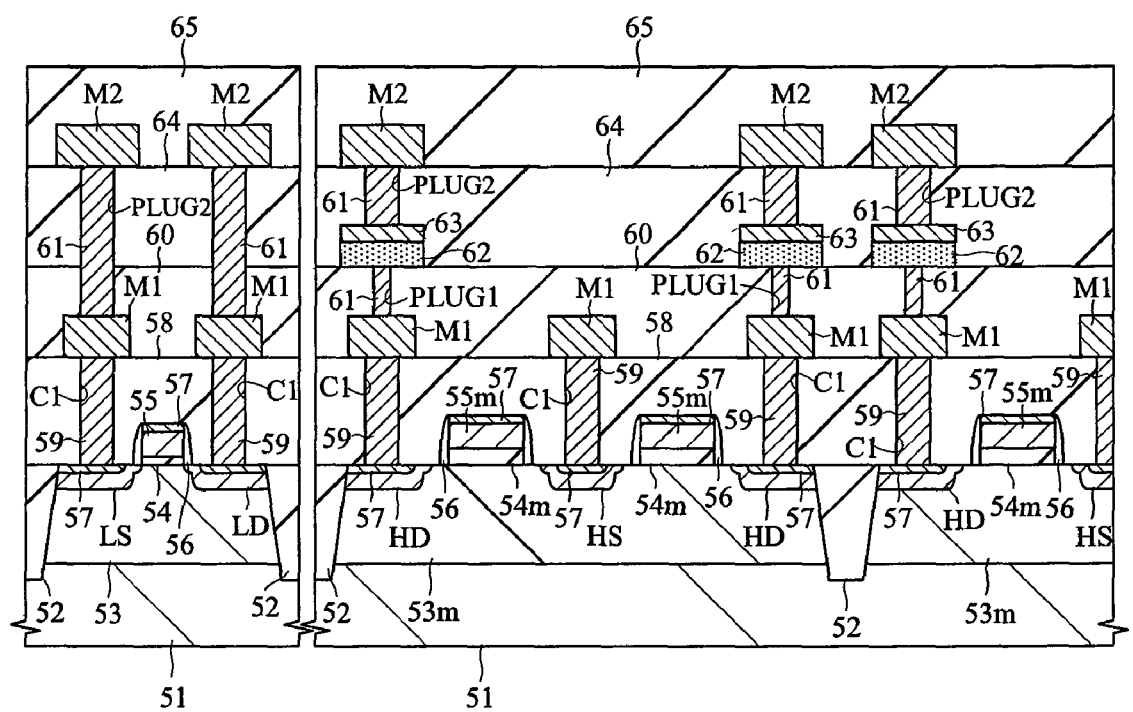
Figure 13:
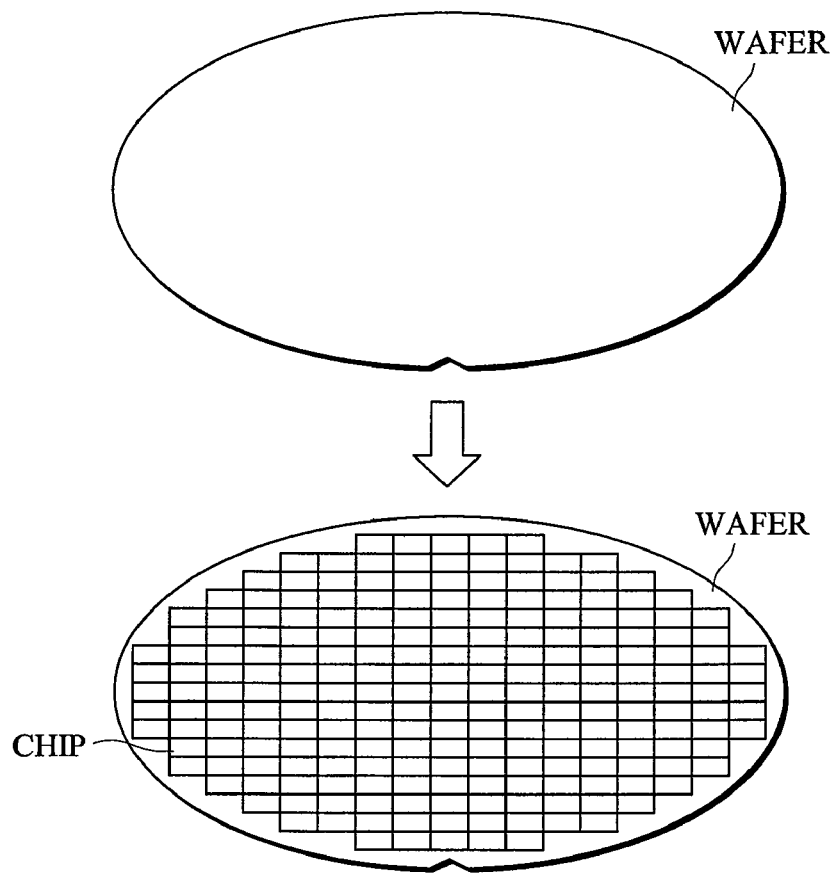
Figure 14:
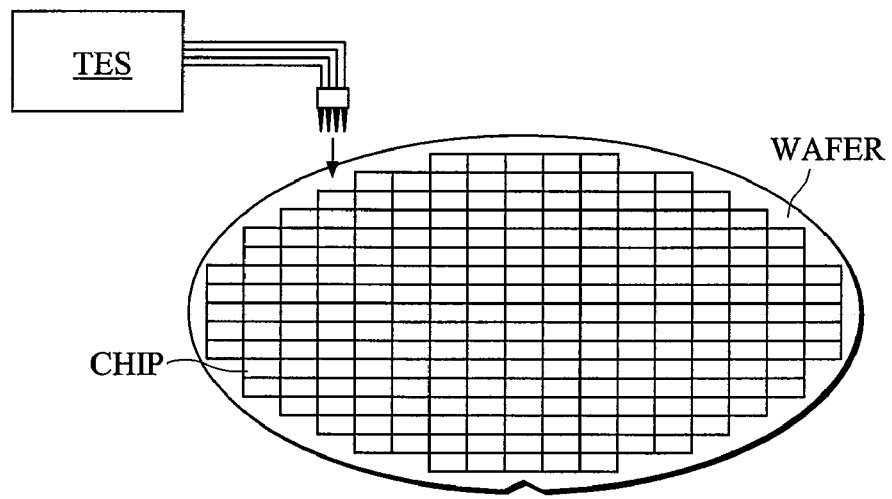
Figure 15:
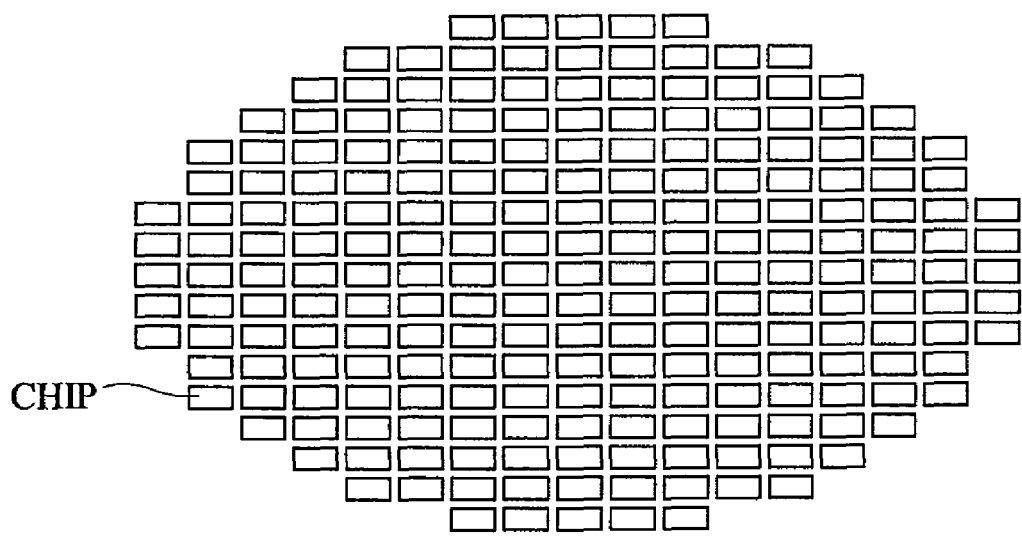
Figure 16:
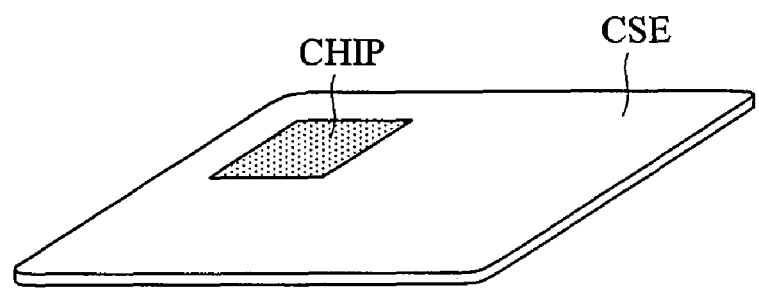
Figure 17:
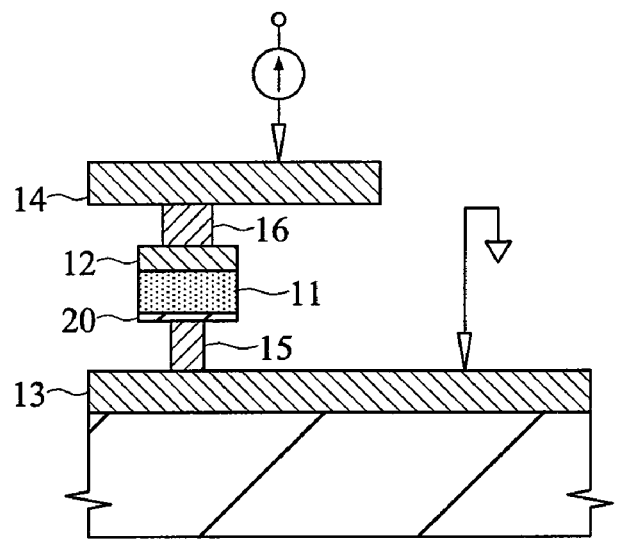
Figure 18:
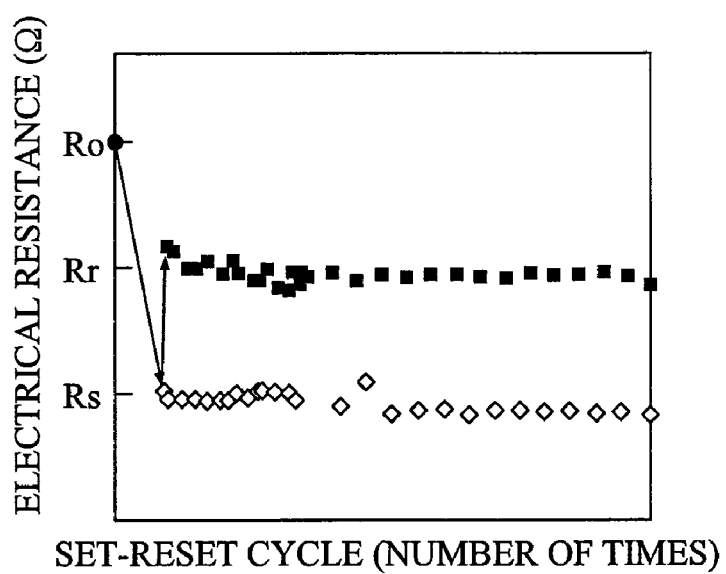
Figure 19:
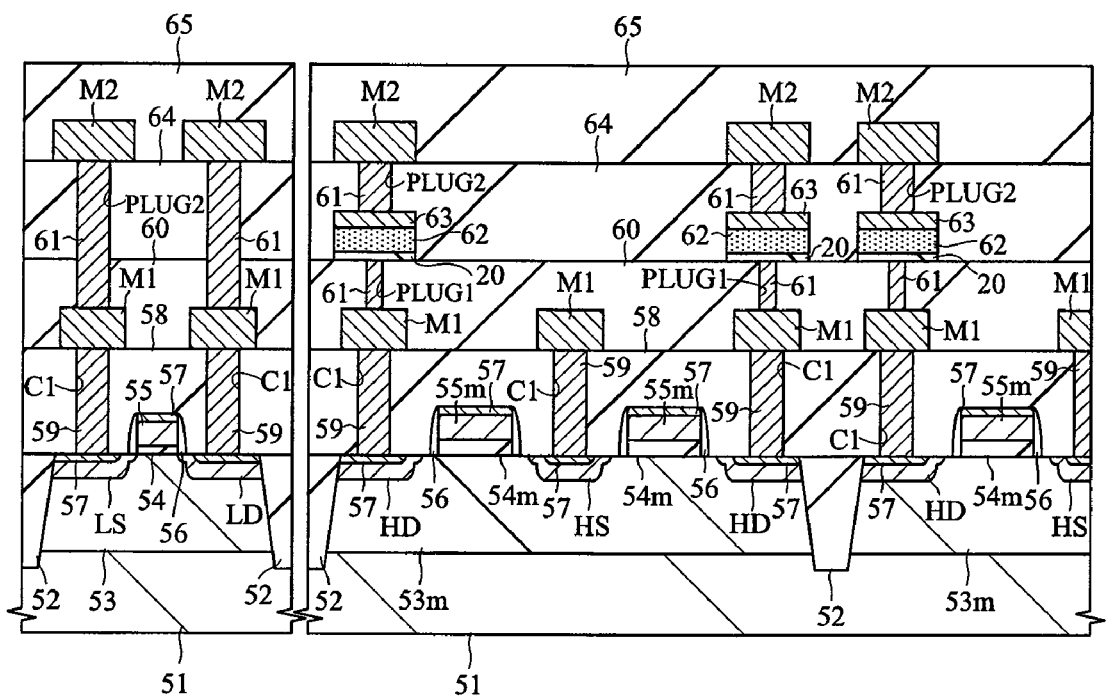
Figure 20:
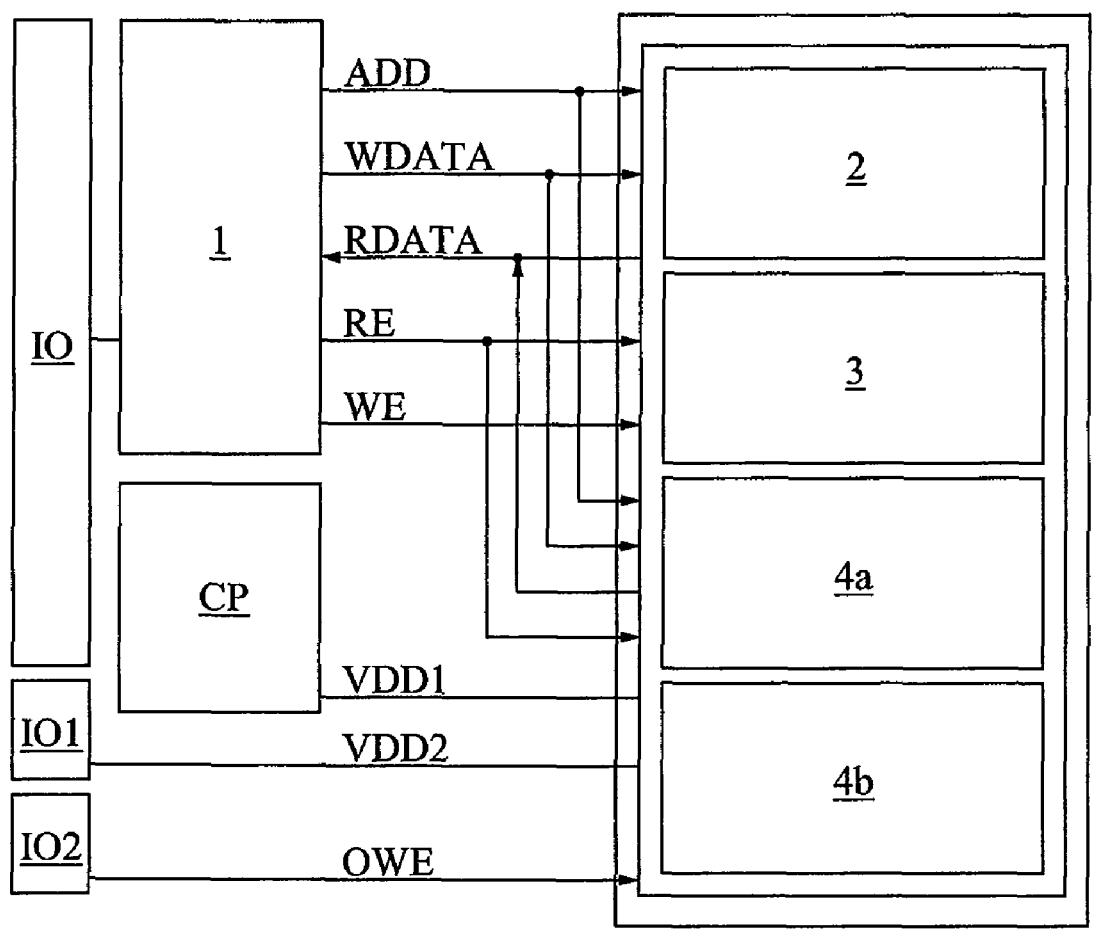

FIG. 5A is a configuration diagram of a second phase change memory device used in an OTPROM according to the first embodiment, FIG. 5B is a schematic view of a cross sectional structure of an information holding section in a high resistance state in the second phase change memory device, and FIG. 5C is a graph showing a relationship between a temperature and a biased time of a voltage in a phase change material;

FIG. 6 is a circuit configuration diagram of the OTPROM according to the first embodiment;

FIG. 7 is a planer layout diagram of the OPROM corresponding to the circuit configuration shown in FIG. 6;

FIG. 8 is a circuit configuration diagram of an EEPROM according to the first embodiment;

FIG. 9 is a planer layout diagram of the EEPROM corresponding to the circuit configuration shown in FIG. 8;

FIG. 10 is a sectional view of a principal part of a semiconductor substrate showing a fabrication step of the semiconductor logic unit according to the first embodiment;

FIG. 11 is a sectional view of a principal part of a semiconductor substrate showing the fabrication step of the semiconductor logic unit according to the first embodiment;

FIG. 12 is a sectional view of a principal part of the semiconductor substrate showing the fabrication step of the semiconductor logic unit according to the first embodiment;

FIG. 13 is a schematic view showing the fabrication step of an IC card according to the first embodiment;

FIG. 14 is a schematic view showing the fabrication step of an IC card according to the first embodiment;

FIG. 15 is a schematic view showing the fabrication step of an IC card according to the first embodiment;

FIG. 16 is a schematic view showing the fabrication step of an IC card according to the first embodiment;

FIG. 17 is a schematic view of a cross sectional structure of an information holding section of a third phase change memory device according to a second embodiment;

FIG. 18 is a graph showing a relationship between electrical resistance of the third phase change memory device used in the OTPROM and a set-reset cycle of information according to the second embodiment;

FIG. 19 is a sectional view of a principal part of a semiconductor substrate showing the third phase change memory device and a peripheral circuit low withstand voltage system nMIS used in the OTPROM according to the second embodiment; and FIG. 20 is a block diagram of an integrated circuit of a semiconductor logic unit according to the second embodiment.

BEST MODE FOR CARRYING OUT THE INVENTION

In the embodiments, the invention will be described in a plurality of the sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

In the embodiments, MISFET (Metal Insulator Semiconductor Field Effect Transistor) representing a field effect transistor is abbreviated as MIS. In the embodiments, when referring to a wafer, it mainly represents a Si monocrystalline wafer, but it does not indicate only the same and it indicates an SOI (Silicon ON Insulator) wafer, an insulation film substrate on which an integrated circuit is formed, or the like.

Also, components having the same function are denoted by the same reference symbols throughout the drawings for describing the embodiments, and the repetitive description thereof is omitted.

First Embodiment

A semiconductor logic unit according to a first embodiment will be described with reference to FIG. 1 to FIG. 16.

Figure 1:
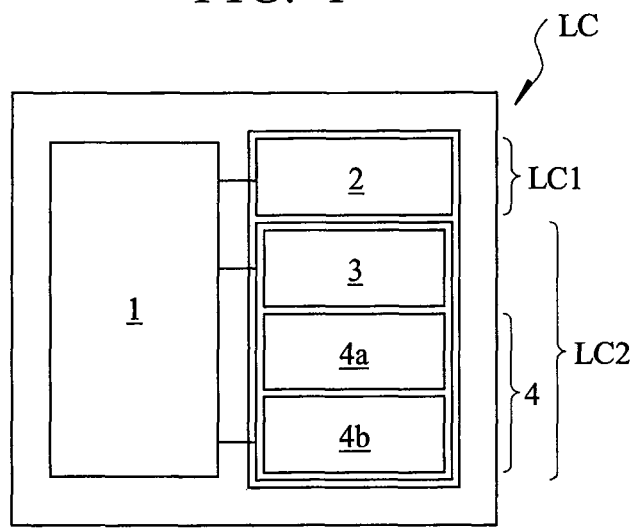
FIG. 1 is a circuit block diagram of a semiconductor logic unit according to a first embodiment.

In FIG. 1, a circuit block diagram of a semiconductor logic unit according to the first embodiment is shown. A semiconductor logic unit LC is configured by a central processing unit (CPU) 1 performing operation, a volatile memory device LC1, and a non-volatile memory device LC2. In the volatile memory device LC1, for example, RAM (Random Access Memory) 2 typified by SRAM (Static Random Access Memory) is formed, while in the non-volatile memory device LC2, for example, EEPROM (Electrically Erasable Programmable Read Only Memory) 3 rewritable of information and a ROM (Read Only Memory) 4 non-rewritable of information only for reading are formed. In the ROMs 4, for example, an OTPROM (One Time Programming Read Only Memory) 4a and a masked ROM (Masked Read Only Memory) 4b are formed. Also, phase change memory devices are used in the EEPROM 3 and the OTPROM 4a formed in the non-volatile memory device LC2.

In general, variation in performance of the semiconductor logic units LC is generated in the fabrication step. Therefore, it is necessary to store voltage selecting information, circuit constant adjusting information, or the like for each of the semiconductor logic units LC. These information items can not be determined at the time of a product designing, and they are written into a portion of the EEPROM 3 after fabricating the semiconductor logic unit LC (after mounting the semiconductor logic unit LC on an IC card, for example, in the first embodiment).

Figure 2:
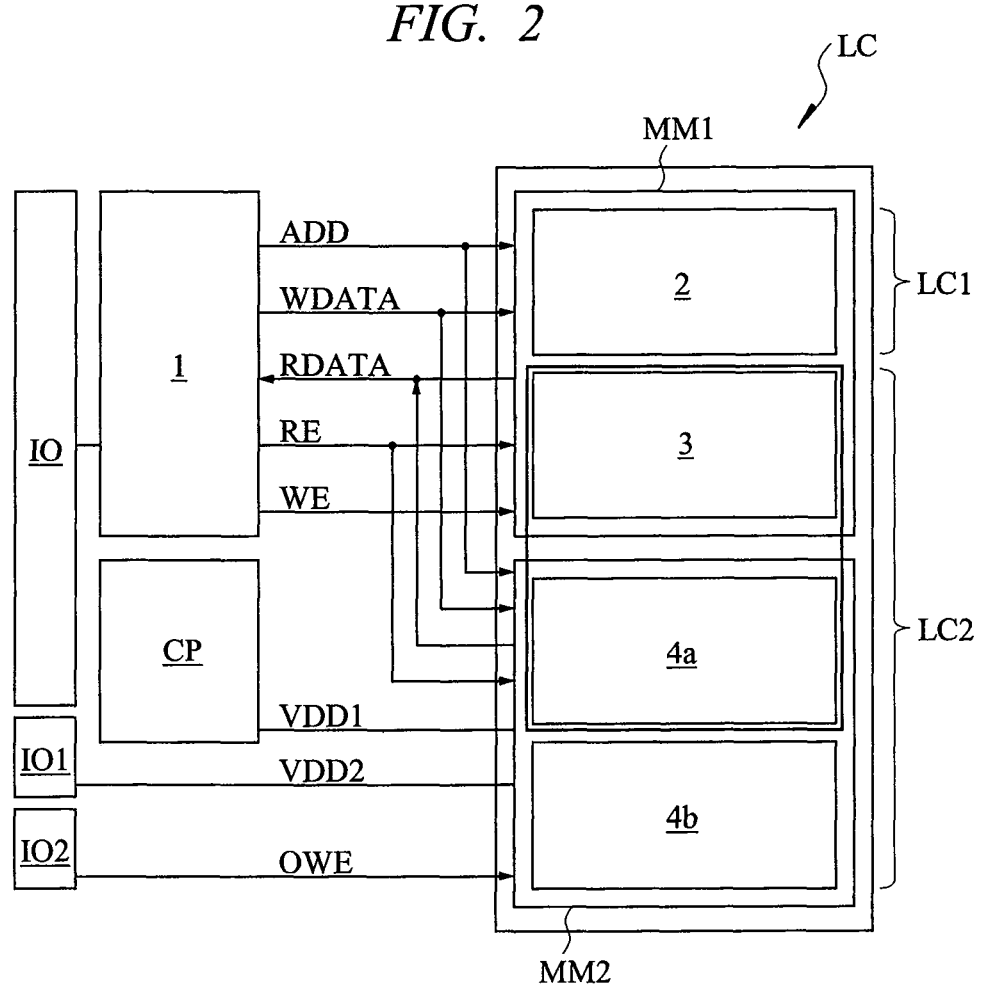
FIG. 2 is a block diagram of an integrated circuit of the semiconductor logic unit according to the first embodiment.

In FIG. 2, a block diagram of an integrated circuit of the semiconductor logic unit according to the first embodiment is shown. In addition to the above-mentioned central processing unit 1, volatile memory device LC1, and non-volatile memory device LC2, an input/output circuit IO, input circuits IO1, IO2, and a booster circuit CP are disposed in the semiconductor logic unit LC. Address ADD, write data WDATA, read control RE, and read data RDATA are inputted from the central processing unit 1 to a memory module MM1 configured by the RAM 2 and the EEPROM 3, and to a one-time-programming-memory module MM2 configured by the OTPROM 4a and the masked ROM 4b. The write control WE is inputted from the central processing unit 1 only to the memory module MM1. Further, a voltage VDD 1 (for example, 10 V) is inputted from the booster circuit CP into the one-time-programming-memory module MM2, a voltage VDD2 (for example, 6 V) is inputted from the input circuit IO1 thereinto, and a one-time-programming-memory-write-control signal OWE is inputted from the input circuit IO2 thereinto. Reading from the one-time-programming module MM2 is performed by the central processing unit 1, and writing therein is performed by a tester or the like.

Phase change memory devices are used as memory cells in the EEPROM 3 and the OTPROM 4a. The phase change memory device can be fabricated at a cost lower than that of such a carrier-trapping type non-volatile memory device such as a floating-gate type non-volatile memory device or MONOS (Metal Oxide Nitride Oxide Semiconductor). Therefore, an inexpensive semiconductor logic unit LC can be provided by using the phase change memory devices for the EEPROM 3 and the OTPROM 4a.

In the present invention, a first phase change memory device used in the EEPROM 3 and a second phase change memory device used in the OTPROM 4a are characterized by that their information storing methods, applications or the like are different from each other, although their information holding sections have the same basic structure. That is, the information holding section of the first phase change memory device used in the EEPROM 3 utilizes a difference in electrical resistance between the amorphous state and the crystal state of the phase change material for the memory information, while the information holding section of the second phase change memory device used in the OTPROM 4a utilizes a difference in electrical resistance between a non-disconnection state and a disconnection state of the phase change material for the memory information. Further, in the case of the first phase change memory device used in the EEPROM 3, writing of the memory information is performed after mounting the semiconductor logic unit LC on, for example, an IC card. In the case of the second phase change memory device used in the OTPROM 4a, writing of the memory information is performed before mounting the semiconductor logic unit LC on, for example, an IC card.

The information holding section of the first phase change memory device used in the EEPROM 3 and the information holding section of the second phase change memory device used in the OTPROM 4a will be described in detail below.

Figure 3A:
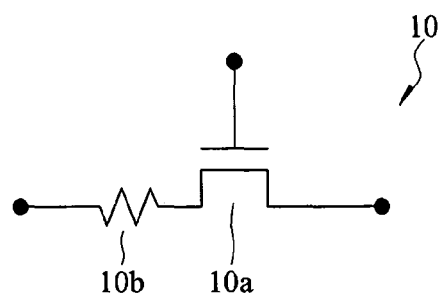
FIG. 3A is a configuration diagram of a first phase change memory device used in an EEPROM according to the first embodiment.
Figure 3B:
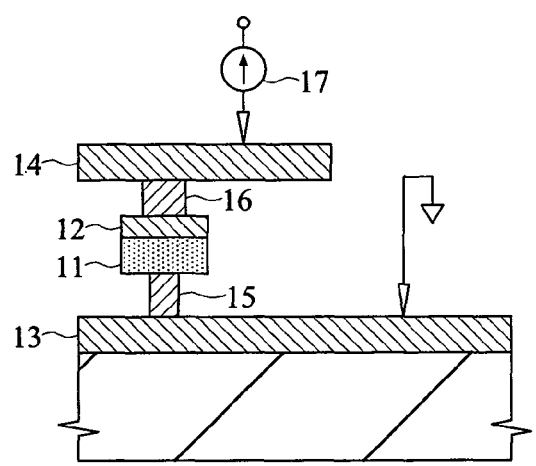
FIG. 3B is a schematic view of a cross sectional structure of an information holding section of the first phase change memory device.

FIG. 3A is a configuration diagram of the first phase change memory device used in the EEPROM according to the first embodiment, and FIG. 3B is a schematic view of a cross-sectional structure of the information holding section of the first phase change memory device.

As shown in FIG. 3A, a phase change memory device 10 is configured by a selection nMIS 10a and an information holding section 10b. Here, MISFET is exemplified as a device functioning as a switch, but a bipolar transistor or a diode may be used.

As shown in FIG. 3B, the information holding section 10b has a structure in which a phase change material 11 and an upper electrode 12 stacked thereon are disposed between a first wiring layer 13 and a second wiring layer 14. The first wiring layer 13 positioned at a lower layer and the phase change material 11 are electrically connected to each other via a first plug 15. The second wiring layer 14 positioned at an upper layer and the upper electrode 12 are electrically connected to each other via a second plug 16. The phase change material 11 is composed of inorganic material such as, for example, Ge—Sb—Te alloy or Ag—In—Te alloy, and a thickness thereof is approximately 100 nm, for example. The upper electrode 12, the first wiring layer 13, and the second wiring layer 14 are composed of electrically conductive material containing Al as a main component, for example.

By carrying a current between the first wiring layer 13 and the second wiring layer 14, joule heat is generated on a side near the first plug 15 or in the first plug itself to change the phase change material 11 from the amorphous state to the crystal state or from the crystal state to the amorphous state.

Figure 4:
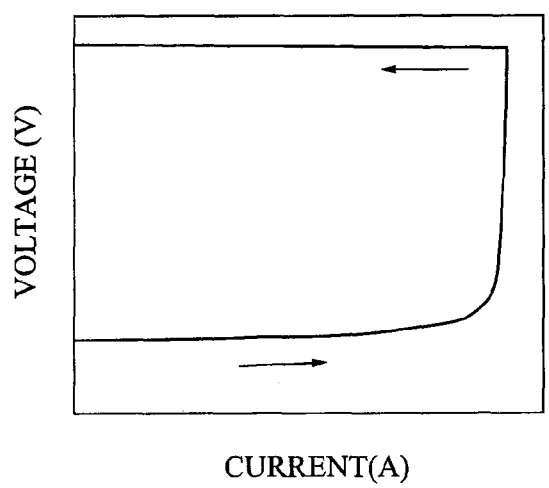
FIG. 4 is a graph showing current-voltage characteristics of the phase change material according to the first embodiment.

FIG. 4 is a graph showing current-voltage characteristics of the phase change material according to the first embodiment (a voltage measured by sweeping the current).

For example, when a current source 17 is connected to the second wiring layer 14 positioned at the upper layer with the information holding section 10b shown in FIG. 3B and sweeping of the current in which the current is gradually increased from an initial state is performed, a region, which a voltage rises rapidly at a certain current value, appears. Thereafter, even if sweeping of the current for decreasing the current is performed, the voltage does not return back to a low voltage of the initial state, so that electrical resistance of the phase change material 11 remains in an extremely high state, namely, an insulated state. In the information holding section of the phase change memory device used in the OTPROM 4a, the disconnection state and the non-disconnection state are used for the memory information.

FIG. 5A is a configuration diagram of the second phase change memory device used in the OTPROM according to the first embodiment, FIG. 5B is a schematic view of a cross sectional structure of the information holding section of the second phase change memory device in a high resistance state, and FIG. 5C shows a relationship between a temperature of the phase change material and a biased time of the voltage.

As shown in FIG. 5A, the second phase change memory device 18 is configured by a selection nMIS 18a and an information holding section 18b. Here, MISFET is exemplified as a device functioning as a switch, but a bipolar transistor or a diode may be used.

As shown in FIG. 5B, a basic structure of the information holding section 18b is the same structure as the information holding section 10b of the first phase change memory device 10 used in the above-mentioned EEPRPM 3. However, in the information holding section 18b in a high resistance state, a cavity 19 with a height of approximately 20 to 30 nm is formed in a portion of the phase change material 11 contacting with an upper portion of the first plug 15. As a result, the phase change material 11 and the upper portion of the first plug 15 are disconnected from each other, so that the information holding section 18b in a high resistance state can be obtained.

When rewriting of the memory information is performed in the information holding section 10b of the first phase change memory device 10 used in the EEPROM 3, the amorphous state is formed, for example, by heating the phase change material 11 up to a melted state and then cooling it rapidly. Change in a temperature of the phase change material when the phase change material 11 becomes amorphous is represented by the line "a" in FIG. 5C. The crystal state is formed, for example, by maintaining the amorphous state of the phase change material 11 at a crystallization temperature and then cooling the phase change material 11. Change in a temperature of the phase change material when the phase change material 11 is crystallized is represented by the line "b" in FIG. 5C. In both cases, the cavity 19 is not formed in the phase change material 11. Incidentally, the crystal state can also be formed, for example, by heating the phase change material 11 up to a melted state and then cooling it gradually.

On the other hand, when a relatively large voltage is applied to the information holding section 18b of the second phase change memory device 18 used in the OTPROM 4a or a relatively large current is passed therethrough, as represented by the line "c" in FIG. 5C, the phase change material 11 has a temperature higher than the case that rewriting of the memory information is performed in the information holding section 10b of the first phase change memory device 10 (the line "a" or the line "b" in FIG. 5C). It is thought that the cavity 19 is formed in the portion of the phase change material 11 contacting with the upper portion of the first plug 15 due to the high temperature. That is, it is thought that the cavity 19 is formed, for example, by cooling the phase change material 11 in a state where the phase change material 11 is exfoliated from an upper face of the first plug 15 after the phase change material 11 is melted and its volume is expanded, or by sublimation of the phase change material 11.

The phase change material 11 has a behavior that crystallization occurs by heat, so that the memory information which has been stored in a high resistance state with amorphous state is lost. However, since the high resistance state can be created by applying a relatively large voltage to the phase change material 11 or carrying a relatively high current thereinto, it is possible to use the second phase change memory device as a memory cell for a heat-resisting non-volatile memory device in which the memory information does not change even at a temperature of, for example, 260° C. When this usage is adopted, just one electrical writing can be allowed, but the memory information can be held even after mounting the memory device on, for example, an IC card.

Next, the OTPROM according to the first embodiment will be described with reference to a circuit configuration diagram shown in FIG. 6.

A memory array MARY constituting the OTPROM is configured by a plurality of word lines and a plurality of bit lines. For example, a second phase change memory device CEL11 is connected to an intersection between a word line WL1 and a bit line BL1. Each second phase change memory device is configured by a selection nMIS and an information holding section. The information holding section has, for example, a low resistance of approximately 1 KΩ to 10 KΩ when the phase change material is in the non-disconnection state and has a high resistance of 100 KΩ or more when the phase change material is in a disconnection state, for example. A gate electrode of the selection nMIS (MN11) is connected with the word line WL1. When the selection nMIS (MN11) is selected, the gate electrode is made to be in a positive voltage, and when is not selected, it is made to be in 0 V, and therefore, control is performed so that the selection nMIS (MN11) is made to be in an ON state or an OFF state correspondingly. One terminal of the second phase change memory device CEL11 is connected to the bit line BL1 and the source electrode of the selection nMIS (MN11) is connected to a ground potential.

A word driver circuit WD1 is connected to the word line WL1. For example, the word driver circuit WD1 is configured by a pMIS (MP1) and an nMIS (MN1). Since a source electrode of the pMIS (MP1) is applied with a voltage VDD1 of, for example, 10 V, the pMIS (MP1) and the nMIS (MN1) are made to be a high withstand voltage MIS. Groups of the word driver circuits WD1, WD2, . . . are arranged in a longitudinal direction to form a word driver block WDARY. An X system address decoder block ADEC is disposed adjacent to the word driver block WDARY.

A column selection circuit YS1 is connected to the bit line BL1. The bit line BL1 is connected to the pMIS (MP31) and is selectively connected to a sense amplifier SA by a control signal YSR1. The control signal YSR1 is supplied from a control circuit CNTL. An amplifier array AMPARY is configured by the sense amplifier SA and a pre-charge circuit PCR. The sense amplifier SA amplifies a signal of the bit line BL1 activated by an activating signal. The pre-charge circuit PCR is configured by a pMIS (MP40) and is controlled by a pre-charge control signal PC to supply a read voltage Vr to the bit line BL1. A write Y switch array WYSARY is configured by a high withstand voltage pMIS, and the gate electrode thereof is connected to a control signal YSW1 and a source electrode thereof is applied with a voltage VDD2 of, for example, 6 V. The control signal YSW1 is controlled by a write address decoder WADEC.

Since the second phase change memory devices CEL11, CEL12, ..., CEL21, CEL22, ... of the OTPROM are applied with a high voltage, phase change materials PCM11, PCM12, ..., PCM21, PCM22, ... and selection nMIS (MN11, MN12, ..., MN21, MN22, ...) connected the phase change material in series are required to have corresponding withstand voltages. In this example, a voltage of 10 V is applied to the word lines WL1, WL2, ..., and a voltage of 6 V is applied to the bit lines BL1, BL2, ..., so that the phase change material of a desired second phase change memory device is insulated. Therefore, MIS of a high withstand voltage system having a withstand voltage of at least 10 V or more is required in order to conduct a normal operation. MIS of a high withstand voltage system described in FIG. 6 includes pMIS (MP1, MP2, MP21, MP22) and nMIS (MN1, MN2, MN11, MN12, MN21, MN22).

In FIG. 7, a planer layout diagram of the OTPROM corresponding to the circuit configuration of the above-mentioned FIG. 6 is shown. In FIG. 7, the eight second phase change memory devices are positioned at intersections between the word lines WL1 to WL4 and the bit lines BL1 and BL2 are shown.

A device isolation SGI is, for example, a shallow trench type, and is generally used for a semiconductor device. A second phase change memory device is positioned at an intersection between the word line WL1 and the bit line BL1. The second phase change memory device is configured by a selection nMIS and a phase change material PCM01. A common source line SL is a wiring layer connected to a source region of the selection nMIS disposed for each second phase change memory device. The phase change material PCM01 is connected to a drain region of the selection RMIS via a lower plug BM01, a first wiring layer M1, and a first plug PLUG1. Further, the phase change material PCM01 is connected to the bit line BL1 via a second plug PLUG2. A gate length of the selection nMIS is formed to be longer than, for example, a gate length of MIS used in core logic on the same substrate so as to withstand a high voltage. In addition, since a high withstand voltage MIS has generally poor driving ability, a gate width of the selection nMIS is formed to be wide, which allows carrying of a large amount of current. In this case, in order to deal with increase in the current, the number of contact holes formed so as to contact with the source region of the selection nMIS is also increased.

As described above, the phase change material PCM01 is disconnected to be in a permanent high resistance state by turning ON the selection nMIS by applying, for example, 6 V to the bit line BL1 and applying, for example, 10 V to the word line WL1. That is, the second phase change memory device has a structure capable of electrically writing the memory information therein, and accordingly the memory information can be easily written in the second phase change memory device via an existing tester. Incidentally, voltages applied to the bit line BL1 and the word line WL1 at this time are only one example and other voltages can be used if a combination thereof can disconnect the phase change material PCM01.

Next, the EEPROM according to the first embodiment will be described with using a circuit configuration diagram shown in FIG. 8. A basic structure of the information holding section is the same structure as the OTPROM (see the above-mentioned FIG. 6) previously explained, but since writing with breakdown of the phase change material is not performed in the EEPROM, the selection nMIS of a high withstand voltage system used in the above-mentioned FIG. 6 is not used. Here, EEPROM, which performs rewriting and reading at a voltage of 1.5 V or less as with MIS used in core logic, is exemplified.

A memory array MARYL constituting the EEPROM is configured by a plurality of word lines and a plurality of bit lines. A first phase change memory device is connected to an intersection between each word line and each bit line. For example, a first phase change memory device CEL11L is disposed at an intersection between a word line WL1L and a bit line BL1L. Each first phase change memory device is configured by a selection nMIS and an information holding section. The information holding section has, for example, a low resistance of approximately 1 KΩ to 10 KΩ when the phase change material is in a crystal state, and has a high resistance of 100 KΩ or more when the phase change material is in an amorphous state. A gate electrode of the selection nMIS (MN11L) is connected with the word line WL1L. When the selection nMIS (MN11L) is selected, the gate electrode is made to be in a positive voltage, and when is not selected, it is made to be in 0 V, and therefore, control is performed so that the selection nMIS (MN11L) is made to be in an ON state or an OFF state correspondingly. One terminal of the phase change memory device CEL11L is connected to the bit line BL1L and the source electrode of the selection nMIS (MN11L) is connected to a ground potential.

A word driver circuit WD1L is connected to the word line WL1L. For example, the word driver circuit WD1L is configured by pMIS (MP1L) for 1.5 V and nMIS (MN1L) for 1.5 V. The source electrode of the pMIS (MP1L) is applied with a voltage VDD3 of, for example, 1.5 V. Groups of these word driver circuits WD1L, WD2L, ..., are arranged in a longitudinal direction to form a word driver block WDARYL. An X system address decoder block ADECL is disposed adjacent to the word driver block WDARYL.

A column selection circuit YS1L is connected to the bit line BL1L. For example, the bit line BL1L is connected with pMIS (MP31L), and it is selectively connected to a sense amplifier SAL by a control signal YSR1L. The control signal YSR1L is supplied from a control circuit CNTLL. An amplifier array AMPARYL is configured by a sense amplifier SAL and a pre-charge circuit PCRL. The sense amplifier SAL amplifies a signal on the bit line BL1L or the bit line BL2L activated by an activating signal. The pre-charge circuit PCRL is configured by pMIS (MP40L), and is controlled by a pre-charge control signal PCL to supply a read voltage VrL to the bit line BL1. A write Y switch array WYSARYL is configured by high withstand voltage pMIS (MP21L, MP22L) and the like, a gate electrode thereof is connected with a control signal YSW1L, and a source electrode thereof is applied a with voltage VDD4 of, for example, 1.5 V. The control signal YSW1L is controlled by a write address decoder WADECL. The EEPROM 3 is different from the OTPROM 4a, and rewrite therein is performed with a voltage of 1.5 V or lower. Therefore, the first phase change memory device including selection MIS of a low withstand voltage system can be used in the EEPROM.

In FIG. 9, a planer layout diagram of the EEPROM corresponding to the circuit configuration of the above-mentioned FIG. 8 is shown. In FIG. 9, the 20 first phase change memory devices positioned at intersections between the word lines WL1L to WL4L and the bit lines BL1L to BL5L are shown.

A device isolation SGI is, for example, a shallow trench type, and is generally used for a semiconductor device. The first phase change memory device is positioned at an intersection between the word line WL1L and the bit line BL1L. The first phase change memory device is configured by the selection nMIS and the phase change material PCM01L. A common source line SLL is a wiring layer connected to a source region of the selection nMIS disposed for each first phase change memory device. The phase change material PCM01L is connected to a drain region of the selection nMIS via a lower plug BM01L, a first wiring layer M1L, and a first plug PLUG1L. Further, the phase change material PCM01L is connected to the bit line BL1L via a second plug PLUG2L. A gate length of the selection nMIS is, for example, the same as a gate length of MIS used in a core logic on the same substrate. An integration degree of the first phase change memory device is required, so that a gate width of the selection nMIS constituting the first phase change memory device is narrower than a gate width of the selection nMIS constituting the second phase change memory device of the OTPROM. Accordingly, the number of contact holes formed on the first phase change memory device of the EEPROM can be less than the number of contact holes formed on the second phase change memory device of the OTPROM. Rewriting and reading are performed at a voltage of 1.5 V or lower.

Next, one example of a fabrication method of the semiconductor logic unit according to the first embodiment will be described with reference to a sectional views of a principal part of a semiconductor substrate shown in FIGS. 10 to 12. In these figures, the second phase change memory device and a peripheral circuit low withstand voltage system nMIS are described. However, the other devices, for example, a peripheral circuit low withstand voltage system pMIS, peripheral circuit high withstand voltage systems nMIS and pMIS, and the like are omitted.

First, as shown in FIG. 10, a device isolation 52 of a shallow trench type is formed in a device isolation region on a main surface of a semiconductor substrate which is composed of, for example, monocrystalline silicon of p type (a thin plate of semiconductor with an approximately circular shape in plan called "semiconductor wafer" in this stage) 51. Then, a predetermined impurity is selectively introduced with predetermined energy by ion implantation, whereby an n-well 53m is formed on a second phase change memory device formation region, and an n-well 53 are formed on a peripheral circuit low withstand voltage system nMIS formation region.

Next, for example, an insulation film 54 with a thickness of approximately 8 nm and an insulation film 54m with a thickness of approximately 20 nm are formed on the main surface of the semiconductor substrate 51. The insulation film 54 constitutes a gate insulation film of the peripheral circuit low withstand voltage system nMIS, while the insulation film 54m constitutes a gate insulation film of the selection nMIS of the second phase change memory device.

Next, for example, after a conductor film composed of low-resistive polysilicon with a thickness of approximately 100 nm is formed on the main surface of the semiconductor substrate 51, the conductive film is processed by etching with a photo-resist pattern as a mask to form a gate electrode 55 of the peripheral circuit low withstand voltage system nMIS and a gate electrode 55m of the selection nMIS. Subsequently, a pair of n-type diffusion layers with a relatively low impurity concentration, which constitute a part of a source and drain of the peripheral circuit low withstand voltage system nMIS and the selection nMIS, is formed. Side-walls 56 are formed on side walls of the gate electrode 55 of the peripheral circuit low withstand voltage system nMIS and the gate electrode 55m of the selection nMIS. Further, a pair of n-type diffusion layers with a relatively high impurity concentration, which constitute other part of the source and drain of the peripheral circuit low withstand voltage system nMIS and the selection nMIS, is formed. Whereby, a source region LS and a drain region LD of the peripheral circuit low withstand voltage system nMIS, and a source region HS and a drain region HD of the selection nMIS are formed. Incidentally, the source region HS and the drain region HD of the selection nMIS are distant from an end of the gate electrode 55m, so that a structure for improving a voltage withstand is made.

Next, a low resistance layer 57 composed of alloy of high melting point metal and silicon is formed on the gate electrode 55, the source region LS, and the drain region LD of the peripheral circuit low withstand voltage system nMIS, and on the gate electrode 55m, the source region HS, and the drain region HD of the selection nMIS, by salicidation (self-aligned silicidation) technique.

Next, after a first interlayer insulator film 58 composed of, for example, silicon oxide is formed on the main surface of the semiconductor substrate 51, the first interlayer insulator film 58 is processed by etching with a photo-resist pattern as a mask to form contact holes C1 so as to expose a part of the semiconductor substrate 51 (for example, the source region LS and the drain region LD of the peripheral circuit low withstand voltage system nMIS, and the source region HS and the drain region HD of the selection nMIS), a part of the gate electrode 55 of the peripheral circuit low withstand voltage system nMIS, and a part of the gate electrode 55m of the selection nMIS.

next, after a TiN (titanium nitride) film and a W (tungsten) film, for example, are sequentially deposited on the main surface of the semiconductor substrate 51 in order from a lower layer, plugs 59 are formed inside the contact holes C1 by polishing these metal films by CMP (Chemical Mechanical Polishing) method so that the metal films are left only in the contact holes C1. Then, after an Al alloy film and a TiN film, for example, are sequentially deposited on the main surface of the semiconductor substrate 51 in order from a lower layer, these metal films are processed by etching with a photo-resist pattern as a mask to form a first wiring layer M1. Thereafter, a second interlayer insulator film 60 composed of, for example, silicon oxide is formed on the main surface of the semiconductor substrate 51.

Next, as shown in FIG. 11, the second interlayer insulator film 60 is processed by etching with a photo-resist pattern as a mask to form the PLUG1 in which a part of the first wiring layer M1 is exposed. Then, after a TiN film and a W film, for example, are sequentially deposited on the main surface of the semiconductor substrate 51 in order from a lower layer, the plug 61 is formed inside the PLUG1 by polishing these metal films by CMP (Chemical Mechanical Polishing) method so that the metal films are left only in the PLUG1.

Next, inorganic material composed of alloy of Ge, Sb, Sn, Se, Zn, Co, Te, or the like is deposited on the main surface of the semiconductor substrate 51, and then a metal film of Al, Au, Cu, Ag, Mo, Ti, W, Ta, or the like is further deposited thereon. Thereafter, the metal film and the inorganic material are sequentially processed by etching with a photo-resist pattern as a mask so that a phase change material 62 composed of the inorganic material and an upper electrode 63 composed of the metal film are formed. Subsequently, a third interlayer insulator film 64 composed of, for example, silicon oxide is formed on the main surface of the semiconductor substrate 51.

The second phase change memory device used in the OTPROM comprises a combination of the selection nMIS of a high withstand voltage system and the information holding section. A gate length of the gate electrode 55m of the selection nMIS of the second phase change memory device shown in FIG. 11 is longer than a gate length of the gate electrode of MIS used in a core logic. Also, a thickness of the gate insulator film 54m of the selection nMIS of the second phase change memory device is thicker than a thickness of the gate insulator film of the gate electrode of MIS used in the core logic. The reason for this is that, for example, a voltage of 10 V, which is higher than, for example, a voltage 1.5 V applied to the gate electrode of MIS used in the core logic, is used in the selection nMIS of the second phase change memory device used in the OTPROM. Incidentally, when the first phase change memory device is used in the EEPROM, a configuration in which the phase change material is connected to the MIS used in the core logic can be adopted, so that an area of the first phase change memory device can be reduced.

Next, as shown in FIG. 12, the third interlayer insulator film 64 is processed by etching with a photo-resist pattern as a mask to form through-holes TH2 in which a part of the upper electrode 63 is exposed. Then, after an Al alloy film and a TiN film, for example, are sequentially deposited on the main surface of the semiconductor substrate 51 in order from a lower layer, these metal films are processed by etching with a photo-resist pattern as a mask to form a second wiring layer M2. Thereafter, a fourth interlayer insulator film INS4 composed of, for example, silicon oxide is formed on the main surface of the semiconductor substrate 51. Whereby, the second phase change memory device comprising the selection nMIS and the information holding section is substantially formed.

Here, the fabrication method of the second phase change memory device which is used in the OTPROM and configured by a combination of the selection nMIS of the high withstand voltage system and the information holding section using the disconnection state and the non-disconnection state of the phase change material, has been described. However, the first phase change memory device which is used in the EEPROM and configured by a combination of the selection nMIS of the low withstand voltage system and the information holding section using the amorphous state and the crystal state of the phase change material, is similarly formed. That is, since the number of fabrication steps of EEPROM is not increased due to provision of the OTPROM, the semiconductor logic unit can be fabricated at a low cost.

Next, steps of mounting the semiconductor logic unit according to the first embodiment on the IC card will be described with reference to FIG. 13 to FIG. 16.

FIG. 13 is a diagram in which a plurality of semiconductor logic units is formed on a main surface of a semiconductor wafer WAFER. Semiconductor devices are formed on the semiconductor wafer WAFER by a unit of one chip CHIP, for example, according to fabrication steps described with reference to the above-mentioned FIG. 10 to FIG. 12.

FIG. 14 is a diagram showing an inspection step of each of semiconductor logic units. The semiconductor wafer WAFER is placed on a measuring stage. Then, while a probe is made to contact with an electrode pad of the semiconductor logic unit to input a signal waveform from an input terminal, a signal waveform is outputted from an output terminal. Inspection whether or not each of the semiconductor logic units operates normally is conducted by reading the outputted signal waveform with an equipment such as a tester TES. At this time, the memory information is written in the OTPROM of each of the semiconductor logic units. That is, in the case where the memory information is stored in the OTPROM, an one time programming memory writing control signal OWE is inputted to a bonding pad connected to the input circuit IO2 shown in FIG. 2 from the tester so that an operation mode of the semiconductor logic unit is changed to a writing mode for the OPTROM, whereby writing is made possible.

FIG. 15 is a diagram showing a cutting step of cutting the semiconductor wafer WAFER into individual chips CHIP. Incidentally, writing in the OTPROM can be performed after the cutting step.

FIG. 16 is a diagram showing a bonding step of bonding the chip CHIP to a plastic card case CSE. At this time, a heat of a temperature of, for example, approximately 200° C. is applied for the bonding process, but information previously written in the second phase change memory device of the OTPROM is not erased. Further, after the chip CHIP is mounted on the plastic card case CSE, the memory information is electrically written into the EEPROM.

Note that, in the first embodiment, the case where the semiconductor logic unit LC is mounted on the IC card has been described, but the semiconductor logic unit LC can be mounted on an embedded micro controller or the like.

As described above, according to the first embodiment, an electrically rewritable non-volatile memory device is configured by the EEPROM 3, and an electrically non-rewritable non-volatile memory device is configured by the OTPROM 4a. The first and second phase change memory devices each of which can be fabricated at the same fabrication step and at a low cost are used in both the EEPROM 3 and the OTPROM 4a, respectively. Whereby, the semiconductor logic unit in which the electrically rewritable non-volatile memory device and the electrically non-rewritable non-volatile memory device are mounted on the same substrate can be fabricated at a low cost. Further, an inexpensive IC card can be provided by mounting the semiconductor logic unit fabricated at a low cost. Incidentally, in the second phase change memory device constituting the OTPROM 4a, the non-disconnection state or the disconnection state in which the memory information is not lost even if heat treatment at a temperature of approximately 260° C. is performed thereto is used as the memory information. Whereby the memory information written in the OTPROM 4a is not lost even if the semiconductor logic unit mounting the OTPROM 4a thereon is mounted on an IC card after the memory information has been written in the OTPROM 4a.

Second Embodiment

A semiconductor logic unit according to a second embodiment will be described with reference to FIG. 17 to FIG. 20.

FIG. 17 is a schematic view of a cross sectional structure of an information holding section of a third phase change memory device according to the second embodiment.

A basic structure of the information holding section of the third phase change memory device is the same as the information holding section 10b of the first phase change memory device 10 shown in the above-mentioned FIG. 3 of the above-mentioned first embodiment, but the difference is that a high resistance barrier layer 20 with a thickness of, for example, 10 nm or less is interposed between the phase change material 11 and the first plug 15. For the high resistance barrier layer 20, oxide or nitride of Ti, Ta, Cr, Al or the like can be used.

FIG. 18 is a graph showing a relationship between electrical resistance and a set-reset cycle of information in the third phase change memory device used in the OTPROM according to the second embodiment.

The third phase change memory device exhibits electrical resistance Ro including electrical resistance of the high resistance barrier layer just after fabricating it, so that the information holding section is made to be in a high resistance state. When a relatively large voltage (for example, approximately 6 V) is applied to the third phase change memory device or a relatively large current is carried thereinto, breakdown of the high resistance barrier layer occurs. This breakdown is not recovered (the insulating state is not realize again) at a temperature of, for example, approximately 200° C. Accordingly, after the high resistance barrier layer is once subjected to breakdown, a difference in electrical resistance between the amorphous state (high resistance Rr state) and the crystal state (low resistance Rs state) of the phase change material can be utilized as the memory information like the information holding section 10b of the above-mentioned first phase change memory device 10. As shown in FIG. 18, since rewriting between the high resistance Rr state and the low resistance Rs state can be repeated plural times, the third phase change memory device can be used in the memory cell of the EEPROM.

After the high resistance barrier layer is subjected to breakdown, the information holding section is made to be always in a state (for example, the high resistance Rr state or the low resistance Rs state is allowable) where a current passes more easily than the electrical resistance Ro including the electrical resistance of the high resistance barrier layer. Accordingly, a difference in electrical resistance of the information holding section between the non-conductive state where the high resistance barrier layer is not subjected to breakdown and the conductive state where the high resistance barrier layer is subjected to breakdown can be utilized as the memory information like the information holding section 18b of the above-mentioned second phase change memory device 18. When this usage is adopted, electric writing can be conducted only one time, but the memory information can be held, for example, after mounting on the IC card. Accordingly, the third phase change memory device can be used in the memory cell of the OTPROM.

FIG. 19 is a sectional view of a principal part of a semiconductor substrate showing the third phase change memory device and the peripheral circuit low withstand voltage system nMIS used in the OTPROM according to the second embodiment.

A basic structure of the third phase change memory device is approximately the same as that of the second phase change memory device 18 shown in the FIG. 5 of the above-mentioned embodiment, and is configured by selection nMIS and an information holding section. However, the difference is that the high resistance barrier layer 20 is interposed between the phase change material 11 and the first plug 15 of the information holding section, as described above. The circuit configuration of the OTPROM using the third phase change memory device may be the same as the circuit configuration of the OTPROM 4a shown in the above-mentioned FIG. 2 and FIG. 3 of the first embodiment.

FIG. 20 shows a block diagram of an integrated circuit of the semiconductor logic unit according to the second embodiment. Here, for example, RAM is formed in a volatile memory device formation region, but the third phase change memory device is formed in a non-volatile memory device formation region without previously making discrimination between EEPROM, ROM, and OTPROM. If necessary, the high resistance barrier layer 20, which is on a portion of the non-volatile memory device formation region, is subjected to breakdown, whereby the phase change memory device of OTPROM or the phase change memory device of EEPROM can be provided, for example.

As described above, according to the second embodiment, an electrically rewritable non-volatile memory device is configured by EEPROM, and an electrically non-rewritable non-volatile memory device is configured by OTPROM. The third phase change memory device which can be fabricated in the same step at a low cost is used in both of the EEPROM and the OTPROM. Whereby, as with the first embodiment, the semiconductor logic unit in which the electrically rewritable non-volatile memory device and the electrically non-rewritable non-volatile memory device are mounted on the same substrate can be fabricated at a low cost.

In the foregoing, the invention made by the present inventors has been concretely described based on the embodiments. However, it is needless to say that the present invention is not limited to the above-mentioned embodiments and may be modified variously without departing from the gist of the invention.

For example, in the embodiment, a region on which OTPROM is formed and a region on which EEPROM is formed are separately provided, but OTPROM may be formed in the region on which EEPROM is formed, if necessary.

INDUSTRIAL APPLICABILITY

The semiconductor device of the present invention can be utilized in a semiconductor logic unit including a non-volatile memory device mounted on an IC card or an embedded micro controller.

The invention claimed is:

1. A semiconductor device comprising, on the same semiconductor substrate, an electrically rewritable first non-volatile memory device, and an electrically non-rewritable second non-volatile memory device,
    wherein the first non-volatile memory device is configured by a first phase change memory device capable of rewriting memory information plural times, and the second non-volatile memory device is configured by a second phase change memory device capable of writing memory information only one time, and information holding sections of the first and second phase change memory devices have the same structure.

2. The semiconductor device according to claim 1,
    wherein the memory information of the first phase change memory device is rewritten by carrying a current into a phase change material.

3. The semiconductor device according to claim 1,
    wherein the memory information of the second phase change memory device is written by carrying a relatively large current into the phase change material or applying a relatively large voltage thereto to disconnect the phase change material.

4. The semiconductor device according to claim 1,
    wherein the first phase change memory device uses an amorphous state and a crystal state of a phase change material for the memory information, and the second phase change memory device uses a non-disconnection state and a disconnection state of a phase change material for the memory information.

5. The semiconductor device according to claim 4,
    wherein by carrying a relatively large current into the phase change material of the second phase change memory device or applying a relatively large voltage thereto, a cavity is formed in the phase change material to make the phase change material of the second phase change memory device to be in the disconnection state.

6. The semiconductor device according to claim 1,
    wherein the first phase change memory device further includes a first selection device of a low withstand voltage system functioning as a switch, and the second phase change memory device further includes a second selection device of a high withstand voltage system functioning as a switch.

7. The semiconductor device according to claim 6,
wherein the first and second selection devices are a field effect transistor, a bipolar transistor, or a diode.

8. The semiconductor device according to claim 1,
wherein the first and second phase change memory devices have a high resistance barrier layer stacked on a phase change material, and the high resistance barrier layers of all of first phase change memory devices are subjected to breakdown.

9. The semiconductor device according to claim 8,
wherein the memory information of the second phase change memory device is written by carrying a relatively large current into the phase change material or applying a relatively large voltage thereto to breakdown the high resistance barrier layer 10. The semiconductor device according to claim 8,
wherein the first phase change memory device uses, for the memory information, an amorphous state and a crystal state of the phase change material, and the second phase change memory device uses, for the memory information, a non-conductive state where the high resistance barrier layer is not subjected to breakdown and a conductive state where the high resistance barrier layer is subjected to breakdown.

11. The semiconductor device according to claim 8,
wherein the first phase change memory device further includes a first selection device of a low withstand voltage system functioning as a switch, and the second phase change memory device further includes a second selection device of a high withstand voltage system functioning as a switch.

12. The semiconductor device according to claim 11,
wherein the first and second selection devices are a field effect transistor, a bipolar transistor, or a diode.

13. The semiconductor device according to claim 1, further comprising a processing unit, and a volatile memory device.

* * * * *